United States Patent
Vieux-Rochaz et al.

[11] Patent Number: 6,069,476
[45] Date of Patent: May 30, 2000

[54] MAGNETIC FIELD SENSOR HAVING A MAGNETORESISTANCE BRIDGE WITH A PAIR OF MAGNETORESISTIVE ELEMENTS FEATURING A PLATEAU EFFECT IN THEIR RESISTANCE-MAGNETIC FIELD RESPONSE

[75] Inventors: Line Vieux-Rochaz, Sassenage; Jean-Marc Fedeli, St. Egreve; Robert Cuchet, Grenoble, all of France

[73] Assignee: Commissariat A L'Energie Atomique, Paris, France

[21] Appl. No.: 09/043,907
[22] PCT Filed: Aug. 7, 1997
[86] PCT No.: PCT/FR97/01465
  § 371 Date: Mar. 31, 1998
  § 102(e) Date: Mar. 31, 1998
[87] PCT Pub. No.: WO98/07042
  PCT Pub. Date: Feb. 19, 1998

[30] Foreign Application Priority Data

Aug. 8, 1996 [FR] France .................................. 96 10004

[51] Int. Cl.[7] .............................. G01R 33/09; H01L 43/08
[52] U.S. Cl. ......................... 324/252; 324/225; 338/32 R
[58] Field of Search ...................... 324/225, 252, 324/207.12, 207.21, 117 R; 360/113; 338/32 R; 365/158

[56] References Cited

U.S. PATENT DOCUMENTS

| | | | |
|---|---|---|---|
| 4,079,360 | 3/1978 | Ookubo et al. ..................... | 324/252 X |
| 4,447,781 | 5/1984 | van Dyke ............................. | 324/252 X |
| 4,533,872 | 8/1985 | Boord et al. ............................. | 324/252 |
| 5,287,238 | 2/1994 | Baumgart et al. . | |
| 5,351,005 | 9/1994 | Rouse et al. . | |
| 5,561,368 | 10/1996 | Dovek et al. .......................... | 324/252 |
| 5,617,071 | 4/1997 | Daughton ............................. | 324/252 X |
| 5,686,837 | 11/1997 | Coehoorn et al. ...................... | 324/252 |

FOREIGN PATENT DOCUMENTS

| | | |
|---|---|---|
| 0710850 | 5/1996 | European Pat. Off. . |
| 2715507 | 7/1995 | France . |
| WO A 9519627 | 7/1995 | WIPO . |

OTHER PUBLICATIONS

Miles J J et al: "Micromagnetic Modelling of Spin Valve and GMR Read Heads" IEEE Transactions on Magnetics, vol. 32, No. 5, pp. 4597–4602.

Publication Entitled: "Magnetoresistance of microscopic strips of thin (NiFe/Ag) multilayers with large bi–quadratic coupling" by S. Young, et al, published in "Journal of Magnetism and Magnetic Materials", 162, 1996, pp. 38–42.

Primary Examiner—Gerard Strecker
Attorney, Agent, or Firm—Oblon, Spivak, McClelland, Maier & Neustadt, P.C.

[57] ABSTRACT

A magnetic field sensor having a magnetoresistance bridge. The sensor includes two longitudinally connected multilayer magnetoresistances and two transversely connected multilayer magnetoresistances. The two longitudinally connected magnetoresistances are sensitive to the magnetic field to be measured. The four magnetoresistances are connected to a wheatstone bridge.

19 Claims, 5 Drawing Sheets

MAGNETIC FIELD SENSOR HAVING A MAGNETORESISTANCE BRIDGE WITH A PAIR OF MAGNETORESISTIVE ELEMENTS FEATURING A PLATEAU EFFECT IN THEIR RESISTANCE-MAGNETIC FIELD RESPONSE

BACKGROUND OF THE INVENTION

1. Field of the Invention

The present invention relates to a magnetic field sensor having a magnetoresistance bridge. It can be used in the measurement of magnetic fields, particularly weak fields, i.e. of a few dozen Oersteds.

2. Discussion of the Background

Field sensors are known formed by four magnetoresistances connected as a WHEATSTONE bridge. FIG. 1 shows an example thereof. Each of the four magnetoresistances is shaped like an elongated bar and are pairwise connected in electrical opposition in the bridge (respectively R1 and R2), terminals being respectively located between the magnetoresistances. The input or supply voltage applied between two terminals of the bridge is designated Ve and the output or measuring voltage between the two other terminals is designated Vs.

In such a connection, only two of the magnetoresistances have to be sensitive to the magnetic field to be measured (e.g. the magnetoresistances R2), otherwise the bridge would be balanced in all circumstances. One of the solutions consists of placing a magnetic shield in front of two of the magnetoresistances, namely the magnetoresistances R1 in FIG. 2, where the shield carries the reference Ec.

Such a sensor is e.g. described in the article by J. DAUGHTON et al entitled "Magnetic Field Sensors Using GMR Multilayer", published in "IEEE Trans on Magnetics", vol. 30, No. 2, March 1994.

Although satisfactory in certain respects, such sensors remain complex due to the means intended to render passive two of the magnetoresistances,

SUMMARY OF THE INVENTION

The object of the present invention is to obviate this disadvantage by avoiding having to have recourse to such a shield.

For this purpose the present invention recommends the longitudinal orientation of two of the magnetoresistances and the transverse orientation of the two others, the orientations being relative to the direction of the field to be measured. Under certain conditions defined hereinafter, the two transversely connected magnetoresistances are insensitive to the variation of the field applied and are consequently neutralized. Only the longitudinally connected magnetoresistances are sensitive to the field applied. Thus, the sought neutralization function is indeed obtained solely through the orientation of the magnetoresistances and without using any supplementary means.

More specifically, the present invention relates to a magnetic field sensor comprising on the one hand at least four magnetoresistances connected to a WHEATSTONE bridge, each magnetoresistance having on at least one part the shape of an elongated bar with a longitudinal direction and a transverse direction, the four magnetoresistances being in pairwise electrical opposition in said bridge, and on the other hand means for supplying voltage to the bridge and means for measuring the asymmetrical voltage of the bridge, said sensor being characterized in that the magnetoresistances are of the multilayer type and that two of the opposing magnetoresistances in the bridge have their longitudinal direction oriented parallel to a direction which is that of the field to be measured, the two others having their transverse direction oriented parallel to said same direction.

The term magnetoresistances of the multilayer type is understood to mean magnetoresistances constituted by a stack of several bilayers, a bilayer having a ferromagnetic layer and a non-magnetic layer, the first and last layers of the stack being in each case ferromagnetic.

The longitudinal magnetoresistances are said to be active and the transverse magnetoresistances are said to be passive.

Advantageously, the sensor also comprises a polarizing means able to apply to at least two magnetoresistances oriented in longitudinal manner a magnetic polarization field. This polarizing means can be a winding or a conductor through which flows a polarizing current, or a permanent magnet.

The winding can surround the two longitudinal magnetoresistances or can surround all the magnetoresistances.

Advantageously, the sensor also comprises a compensation means able to apply a magnetic compensating field at least to the two longitudinally oriented magnetoresistances. Said compensation means can comprise a winding through which flows a compensating current or a conductor through which flows a compensating current.

According to another embodiment the sensor can comprise a compensation means able to apply a field to the two transversely connected magnetoresistances.

In preferred manner, the multilayer-type magnetoresistances are based on FeNi/Ag.

DESCRIPTION OF THE PREFERRED EMBODIMENTS

Figure 3:
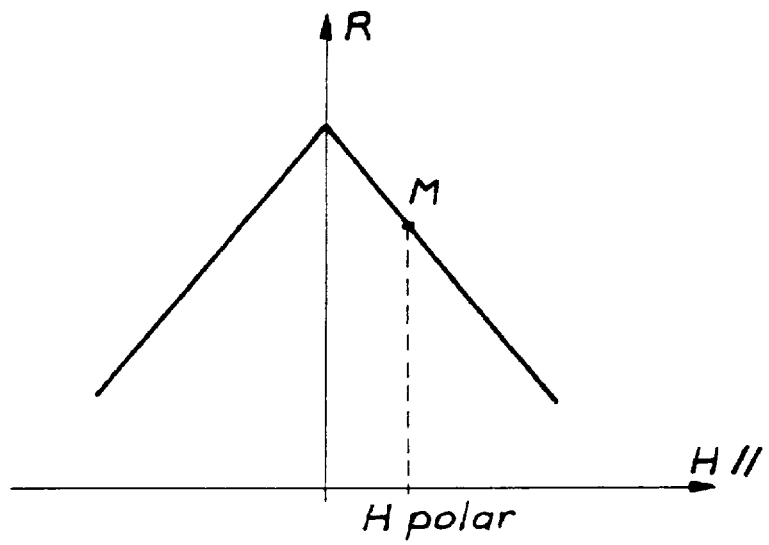
FIG. 3 shows the resistance variations of a giant multilayer magnetoresistance as a function of a magnetic field applied parallel to the longitudinal axis of the magnetoresistance.
Figure 4:
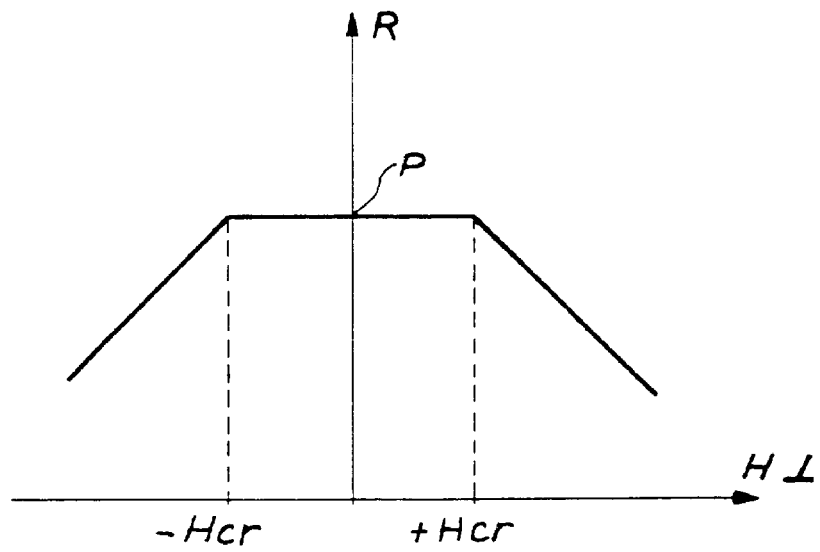
FIG. 4 shows the resistance variations of a giant multilayer magnetoresistance as a function of a magnetic field applied parallel to the transverse axis of the magnetoresistance.

FIGS. 3 and 4 show the operating principle of the multilayer magnetoresistances used according to the invention. These magnetoresistances are sometimes referred to as giant magnetoresistances.

FIG. 3 shows the variation of the resistance R of such a magnetoresistance as a function of the magnetic field applied parallel to the bar (field designated $H_{//}$). The resistance decreases substantially linearly with the field on either side of the value obtained for a zero field. By applying a permanent magnetic field Hpolar, it is possible to polarize the magnetoresistance in order to make it operate around a point M spaced from the apex of the curve.

FIG. 4 illustrates the behaviour of such a magnetoresistance as a function of a field applied perpendicular to the magnetoresistive bar (field designated $H_\perp$). FIG. 4 shows a plateau between two critical values –Hcr and +Hcr, along which the resistance does not vary. On either side of said plateau, the resistance decreases quasi-linearly with the field.

The magnetoresistances, some of which are connected longitudinally and others transversely, according to one of the essential features of the invention, will therefore function differently according to their orientation. If a polarizing field is solely applied to the longitudinal magnetoresistances, the operating point of the bridge will be defined by the point M for the two longitudinal magnetoresistances and by the point P, at the centre of the plateau, for the two transverse magnetoresistances (which are not polarized in this particular case). The application of a magnetic field to all four magnetoresistances will therefore reduce or increase the resistance of the two longitudinal magnetoresistances (as a function of the field direction), but will leave unchanged the resistance of the two transverse magnetoresistances if the field is between –Hcr and +Hcr. Accordingly, the bridge will be unbalanced and the unbalance or asymmetrical voltage will reflect the value of the field applied.

In general terms, the resistance variation as a function of the field applied of a multilayer stack of the type where there is a succession of bilayers (a bilayer comprising a ferromagnetic layer and a non-magnetic layer), the total being observed as a full layer, is an isotropic variation in the sense that no matter what the direction of the field applied, the response is the same and is triangular. On etching in said full layer of bars, it is possible to bring about the appearance of an anisotropy in the response of the bar as a function of the direction of the field applied, by appropriately choosing the bar dimensions. When the field is applied parallel to the length of the bar, the response remains triangular as for the full layer response. However, when the field is applied transversely to the length of the bar, the response leads to the appearance of a plateau at its apex, i.e. the "plateau effect".

This plateau effect is described in a publication entitled "Magnetoresistance of microscopic strips of thin (NiFe/Ag) multilayers with large bi-quadratic coupling" by S. Young et al, published in "Journal of Magnetism and Magnetic Materials", 162, 1996, pp 38–42. In paragraph 3 of said publication information is given on the experimental results obtained on bars having a length of 500 $\mu$m, a thickness of 0.05 $\mu$m and different widths.

Figure 1:
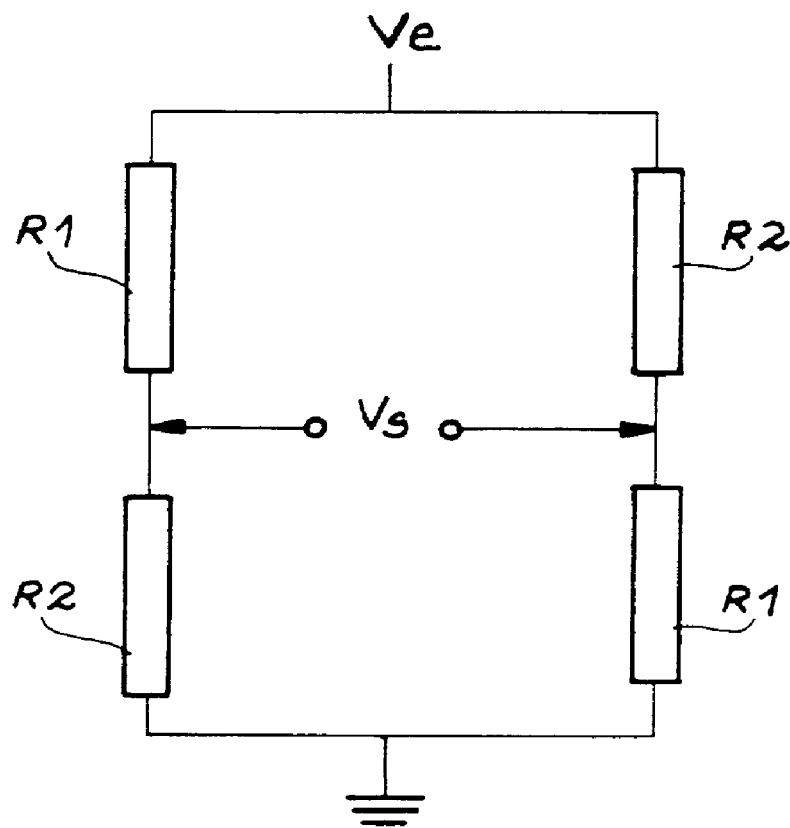
FIG. 1, already described, illustrates the general structure of a prior art sensor having four bridge-connected magnetoresistances.
Figure 2:
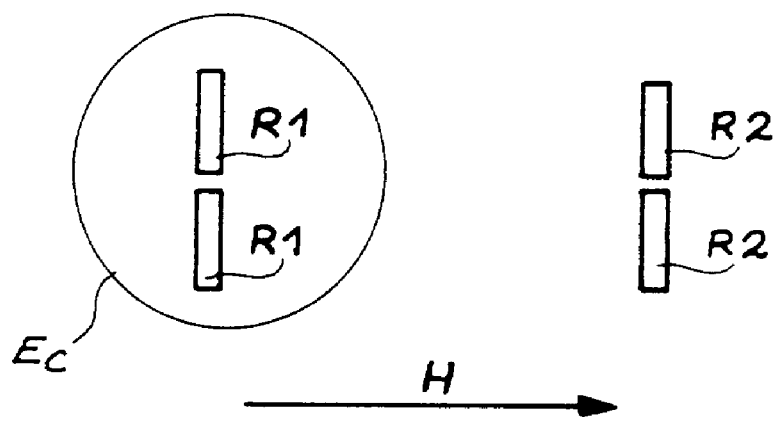
FIG. 2, already described, shows a shield making two of the magnetoresistances of the bridge insensitive.

These results demonstrate that the plateau is solely observed in the case where the field is applied transversely to the length of the bar and that the extent of the plateau varies linearly with the inverse of the width of the bar, for a given thickness and as is shown in FIG. 1 of the document.

According to the theory if the thickness of the bar increases, the extent of the plateau increases, the width of the bar remaining constant, because the extent of the plateau is proportional to t/w, in which t is the thickness and w the width of the bar.

In the present invention use is made of this plateau effect for obtaining a WHEATSTONE bridge of four magnetoresistances, in which at least two magnetoresistances have a ratio t/w giving a plateau effect (e.g. width below 40 $\mu$m for a thickness of approximately 0.05 $\mu$m) and which are positioned in such a way that their length is perpendicular to the field applied. The two other magnetoresistances resistances are positioned in such a way that their length is parallel to the field applied, whereby their width can be of the same order as that of the two others, but can also be larger or narrower (this has no effect on the shape of the response, which always remains triangular, because the field is parallel to the length of these bars).

Figure 5:
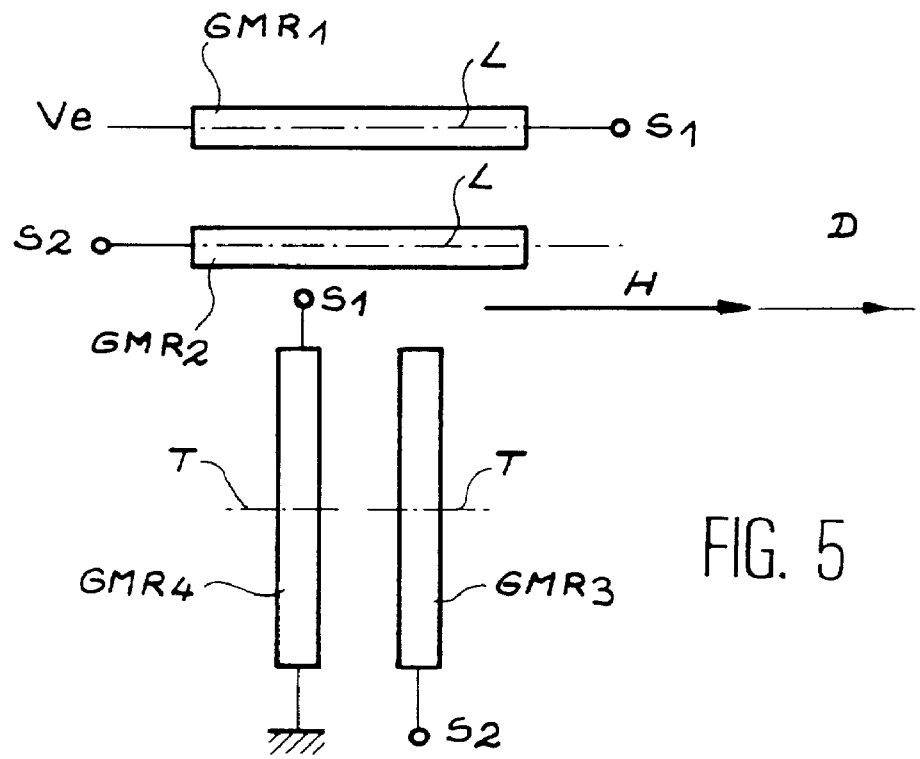
FIG. 5 illustrates the general structure of a sensor according to the invention.
Figure 6:
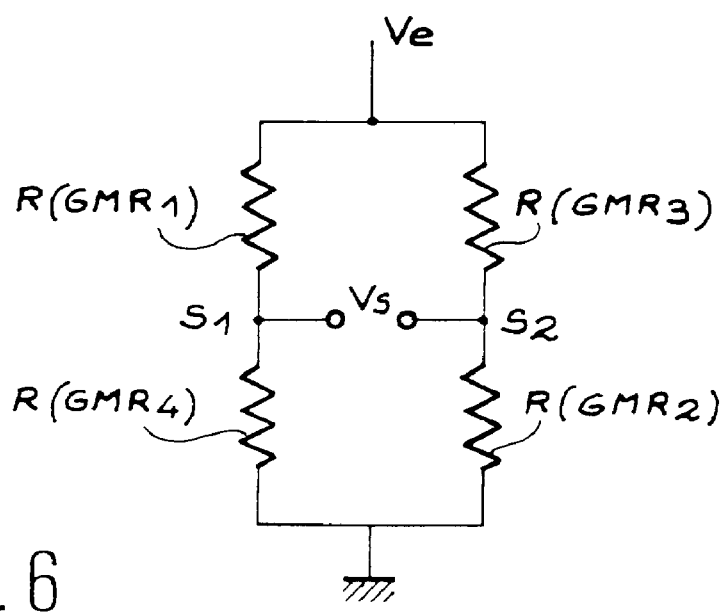
FIG. 6 illustrates the electrical WHEATSTONE bridge connection.

The sensor according to the invention is then in the form illustrated in FIGS. 5 and 6. FIG. 5 shows the respective orientation of the magnetoresistive bars. The bars GMR1 and GMR2 have their longitudinal axis L parallel to a direction D, which is that of the field H to be measured, whilst the bars GMR3, GMR4 have their transverse axes T parallel to said direction. Therefore the field applied H is longitudinal for GMR1 and GMR2 and transverse for GMR3 and GMR4.

FIG. 6 shows the electrical connections making it possible to form a WHEATSTONE bridge. The magnetoresistances are represented by their resistance. The resistances R(GMR1) and R(GMR2) are connected in opposition, as are the resistances R(GMR3) and R(GMR4). The measuring voltage Vs is taken between the points S1 and S2 located between R(GMR1) and R(GMR4) on the one hand and R(GMR3) and R(GMR2) on the other. The supply voltage Ve is applied between R(GMR1) and R(GMR3) on the one hand and R(GMR4) and R(GMR2) on the other.

FIG. 6 applies to electrical resistances and not to the actual magnetoresistive bars, as for FIG. 5. The orientation of the resistances R(GMR1) in the electrical diagram of FIG. 6 consequently has no link with the orientation of the corresponding bars GMR1, etc. of FIG. 5.

Figure 7:
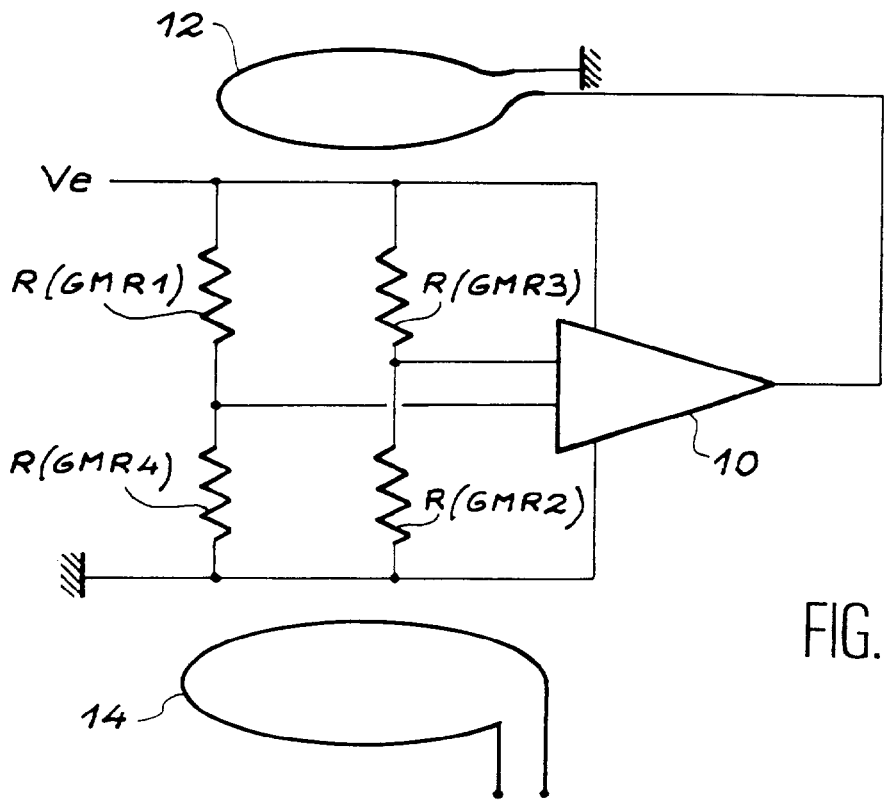
FIG. 7 illustrates an embodiment of a compensating circuit.

According to an advantageous embodiment, the sensor is provided with a compensation means constituted by any means and e.g. having a winding or flat conductor through which an appropriate current flows. Thus, FIG. 7 diagrammatically shows a comparison and detection circuit 10, whose inputs receive the asymmetrical voltage Vs of the bridge, and the output supplies a compensating winding 12. At the level of the two longitudinal magnetoresistances, these means make it possible to obtain a zero overall field (so-called zero method), in which case it is the compensating signal which constitutes the measuring signal.

The diagram of FIG. 7 also shows a winding 14, which is the polarizing winding of the longitudinal magnetoresistances.

Figure 8:
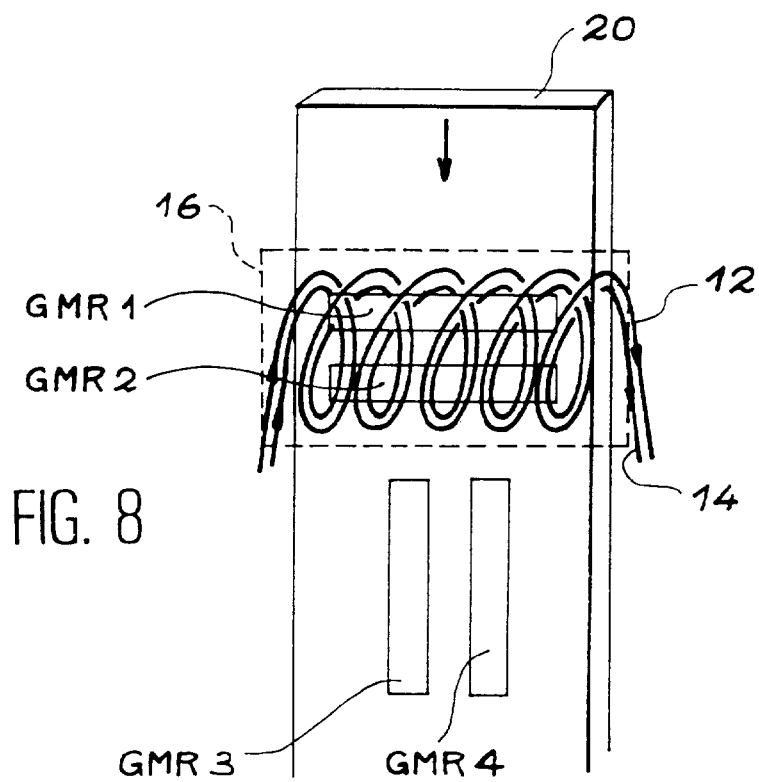
FIG. 8 illustrates an embodiment having a double polarizing and compensating winding.

FIG. 8 shows a possible practical arrangement. In this embodiment, the magnetic field to be measured is that which results from the flow of a current in a flat conductor 20. The sensor shown comprises two windings 12 and 14, the first a compensating winding and the second a polarizing winding. These two windings surround the magnetoresistances GMR1 and GMR2. The polarizing winding can be replaced by a polarizing magnet 16 or a flat conductor. Moreover, the polarizing winding and/or compensating winding can surround all the magnetoresistances.

The sensor according to the invention only functions correctly if the field applied to the transverse magnetoresistances does not exceed the critical value limiting the plateau along which the resistance of the magnetoresistances remains constant. It this is not the case, the sensor is provided with a second compensating means, e.g. incorporating a winding or flat conductor through which a current flows. The thus formed compensation field lowers the total field and makes it possible to bring the latter to a value corresponding to the plateau, namely a zero value.

The compensation means of the transverse magnetoresistances can also act on the longitudinal magnetoresistances. It can e.g. be a single flat conductor passing above or below the four magnetoresistances and through which flows a current, or a single winding surrounding the four magnetoresistances.

Figure 9A:
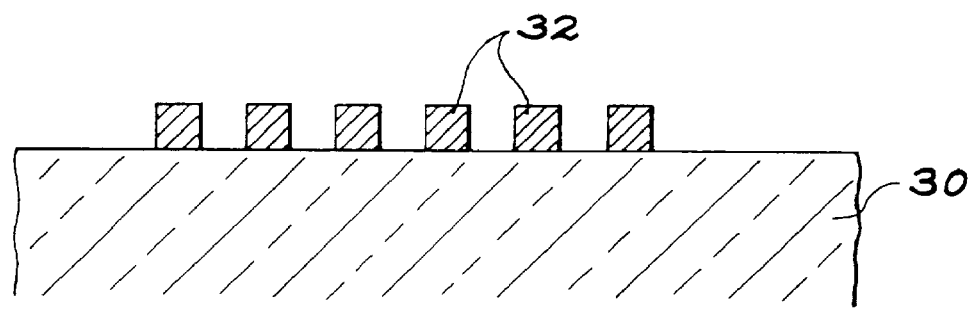
FIGS. 9a, 9b and 9c illustrate an embodiment of the sensor according to the invention.
Figure 9B:
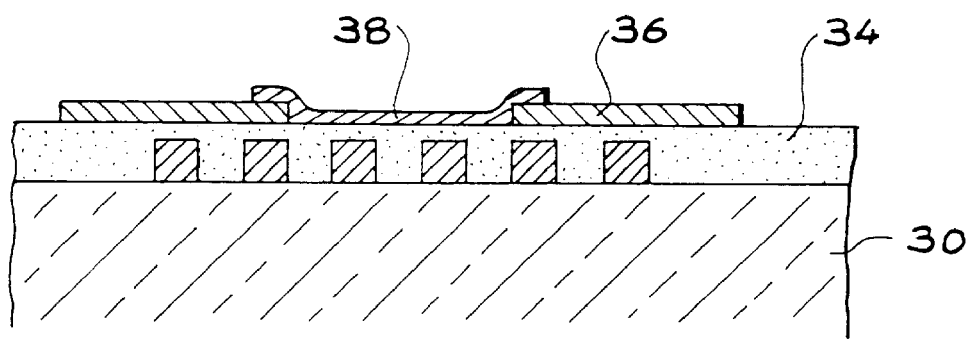
Figure 9C:
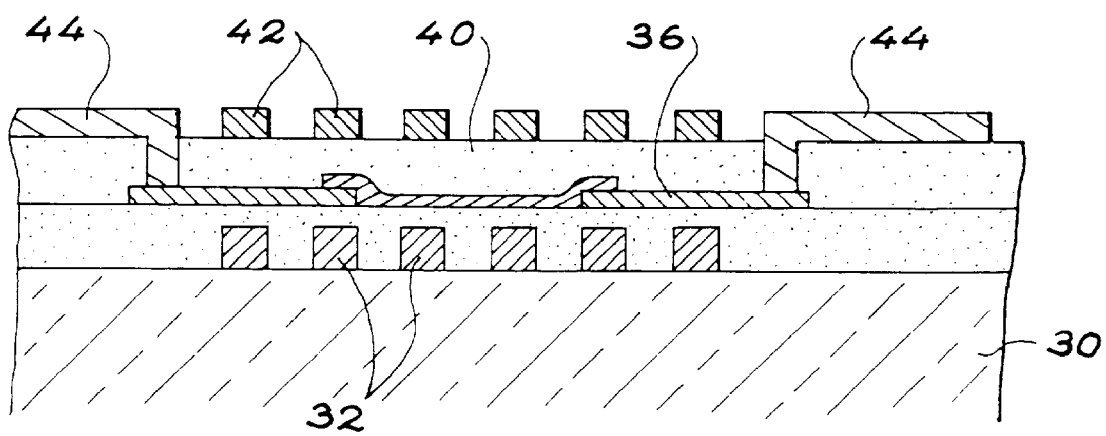

FIGS. 9a, 9b and 9c illustrate an embodiment of a sensor according to the invention. These drawings are sections passing through one of the two longitudinal magnetoresistances, which are assumed to be surrounded by a common polarizing and compensating winding.

With reference to FIG. 9a, it is possible to see that there is an e.g. silicon substrate 30 on which is deposited a conductive material layer, e.g. of gold, copper, etc. Said layer is etched in order to form a sheet of lower conductors 32.

On said first subassembly is deposited an insulating layer 34 (cf. FIG. 9b), e.g. of silica and then a conductive material layer 36, e.g. a CrAu alloy. This material is etched so as to only leave two connecting tabs on either side of the location reserved for the future magnetoresistances. Thus, after etching, the sub-assembly has eight connecting tabs. On the assembly is then deposited a magnetoresistive multilayer stack and the latter is etched so as to leave two bars oriented in one direction and two other bars oriented perpendicular to said direction. The bar shown in FIG. 9b carries the reference 38. The ends of these bars rest on the connecting tabs 36 which have already been formed.

According to FIG. 9c an insulating material layer 40 is then deposited. Said layer is then etched with openings to the right of the ends of the lower conductors 32, as well as to the right of the rear of the connecting tabs. A conductive material layer, e.g. of gold or copper is then deposited. This material fills the openings made and thus makes contact with the sheet of lower conductors 32 and the connecting tabs 36. This conductive layer is then etched in order to obtain a sheet of upper conductors 42 and connections 44 for the magnetoresistances.

The magnetoresistances described up to now are rectangular bars. These bars can have a width below 40 µm and a thickness exceeding 0.01 µm, so as to have a plateau effect. However, advantageously, the smaller the width the wider the plateau and can e.g. give critical H values of approximately 150 Oe (or even higher), for widths of 1 µm or lower.

It would obviously not pass outside the scope of the present invention to use more complex forms or shapes, provided that at least part of the magnetoresistances is longitudinally directed. Another part can optionally be directed transversely, because it will have no effect on the resistance change of the assembly. It is then e.g. possible to use magnetoresistances in Greek-key pattern or any other pattern.

The two longitudinally oriented magnetoresistances GMR1, GMR2 can have identical structures and compositions and the two transversely oriented magnetoresistances GMR3 and GMR4 can have identical structures and compositions.

We claim:

1. A magnetic field sensor for detecting an applied magnetic field, comprising:

first, second, third and fourth multilayer magnetoresistive elements connected in a Wheatstone bridge circuit, a voltage source configured to apply a voltage between a first point and a second point, said first point being connected to said first and third multilayer magnetoresistive elements, said second point being connected to said second and fourth multilayer magnetoresistive elements; and a voltage measurement circuit configured to measure an unbalanced voltage between a third point and a fourth point, said third point being connected to said first and fourth multilayer magnetoresistive elements, said fourth point being connected to said second and third multilayer magnetoresistive elements, wherein:

said first and second multilayer magnetoresistive elements are positioned substantially parallel to a direction of said applied magnetic field, said third and fourth multilayer magnetoresistive elements are positioned substantially perpendicular to said direction of said applied magnetic field, the first, second, third and fourth multilayer magnetoresistive elements comprise stacks of several bilayers, a bilayer comprising a ferromagnetic layer and a non-magnetic layer, a first layer and a last layer of the stacks being ferromagnetic, and the third and fourth multilayer magnetoresistive elements have a plateau effect in their respective resistance versus magnetic field responses.

2. The sensor according to claim 1, further comprising a polarizing device configured to apply to at least said first and second multilayer magnetoresistive elements a longitudinally directed, polarizing magnetic field.

3. The sensor according to claim 2, wherein the polarizing device comprises a winding through which a polarizing current flows.

4. The sensor according to claim 3, wherein the winding surrounds the first and second multilayer magnetoresistive elements.

5. The sensor according to claim 3, wherein the winding surrounds all the multilayer magnetoresistive elements.

6. The sensor according to claim 2, wherein the polarizing device comprises a permanent magnet.

7. The sensor according to claim 1, further comprising a first compensation device configured to apply at least one longitudinal, compensating magnetic field to the first and second multilayer magnetoresistive elements.

8. The sensor according to claim 7, wherein the first compensation device comprises a comparator receiving the unbalanced voltage and supplying a voltage, which is applied to a compensating winding surrounding at least the first and second multilayer magnetoresistive elements.

9. The sensor according to claim 8, wherein the compensating winding surrounds the four multilayer magnetoresistive elements.

10. The sensor according to claim 1, further comprising a second compensation device configured to apply a transverse compensating field to the third and fourth multilayer magnetoresistive elements.

11. The sensor according to claim 10, wherein the second compensation device comprises a conductor through which a current flows, said conductor passing above the third and fourth multilayer magnetoresistive elements.

12. The sensor according to claim 2, wherein the polarizing device comprises a conductor passing above the four multilayer magnetoresistive elements, whereby through said conductor flows a current normal to the longitudinal axis of the first and second multilayer magnetoresistive elements and to the transverse axis of the third and fourth multilayer magnetoresistive elements.

13. The sensor according to claim 1, wherein the first and second multilayer magnetoresistive elements have identical structures and compositions and the third and fourth multilayer magnetoresistive elements have identical structures and compositions.

14. The sensor according to claim 10, wherein the multilayer magnetoresistive elements are bars with a width below 40 $\mu$m.

15. The sensor according to claim 14, wherein the multilayer magnetoresistive elements are bars with a thickness above 0.01 $\mu$m.

16. The sensor according to claim 1, wherein the multilayer magnetoresistive elements comprise FeNi/Ag.

17. The sensor according to claim 7, wherein the first compensation device comprises a conductor through which a current flows, said conductor passing above the first and second multilayer magnetoresistive elements.

18. The sensor according to claim 1, wherein the third and fourth multilayer magnetoresistive elements have a thickness-to-width ratio such that the third and fourth multilayer magnetoresistive elements have a plateau effect in their respective resistance versus magnetic field responses.

19. The sensor according to claim 18, wherein said thickness-to-width ratio is greater than $2.5 \times 10^{-4}$.

* * * * *